United States Patent
Wang et al.

(10) Patent No.: US 10,996,642 B2
(45) Date of Patent: May 4, 2021

(54) METHOD AND APPARATUS FOR DETERMINING DATA READING CYCLE

(71) Applicants: Siemens Aktiengesellschaft, Munich (DE); He Yu, Wuxi (CN); Qi Wang, Wuhan (CN); Yong Yuan, Beijing (CN); Ming Zhang, Wuxi (CN); Teng Fei Wu, Wuxi (CN)

(72) Inventors: Qi Wang, Wuhan (CN); Yong Yuan, Beijing (CN); He Yu, Wuxi (CN); Ming Zhang, Wuxi (CN); Teng Fei Wu, Wuxi (CN)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 16/479,011

(22) PCT Filed: Aug. 29, 2017

(86) PCT No.: PCT/CN2017/099539
§ 371 (c)(1),
(2) Date: Jul. 18, 2019

(87) PCT Pub. No.: WO2019/041145
PCT Pub. Date: Mar. 7, 2019

(65) Prior Publication Data
US 2020/0183345 A1    Jun. 11, 2020

(51) Int. Cl.
*G05B 17/02* (2006.01)
*G06F 16/28* (2019.01)

(52) U.S. Cl.
CPC ........... *G05B 17/02* (2013.01); *G06F 16/285* (2019.01)

(58) Field of Classification Search
CPC ..................................................... G05B 17/02
(Continued)

(56) References Cited

U.S. PATENT DOCUMENTS 9,454,537 B2 *   9/2016  Prahlad .............. G06F 16/1827
10,755,003 B2 *  8/2020  Maturana ................. G06F 1/14
(Continued)

FOREIGN PATENT DOCUMENTS

| CN | 1490690 A | 4/2004 |
| CN | 1682196 A | 10/2005 |
| CN | 103942372 A | 7/2014 |

OTHER PUBLICATIONS

International Search Report PCT/ISA/210 for International Application No. PCT/CN2017/099539 dated Aug. 29, 2017.
(Continued)

*Primary Examiner* — Md Azad
(74) *Attorney, Agent, or Firm* — Harness, Dickey & Pierce, P.L.C.

(57) ABSTRACT

In the field of industrial automation, a method and device are for determining a data reading period for determining a data reading period of data in an industrial control system, and are capable of automatically configuring the data reading period to obtain a better configuration result. In embodiments of the present invention, an industrial control system in different states is simulated by using simulation software to obtain a simulation model and simulation data. Data features of the industrial control system in different states that is simulated can be extracted respectively, and a data reading period is determined according to the extracted data features. Automatic configuring of a data reading period is implemented.

13 Claims, 5 Drawing Sheets

(58) Field of Classification Search
USPC .......................................................... 700/29
See application file for complete search history.

(56) References Cited

U.S. PATENT DOCUMENTS

| | | | |
|---|---|---|---|
| 2002/0035465 A1* | 3/2002 | Sinclair ................. | G05B 17/02 |
| | | | 703/22 |
| 2004/0049295 A1 | 3/2004 | Wojsznis | |
| 2004/0049565 A1 | 3/2004 | Keller et al. | |
| 2008/0297513 A1 | 12/2008 | Greenhill et al. | |
| 2015/0277406 A1* | 10/2015 | Maturana ............... | G05B 17/02 |
| | | | 700/83 |
| 2019/0130057 A1* | 5/2019 | Asenjo .................... | G06F 30/20 |

OTHER PUBLICATIONS

Written Opinion of the International Searching Authority PCT/ISA/237 for International Application No. PCT/CN2017/099539 dated Aug. 29, 2017.
Y Naganuma et al: "Same Steelmaking Process Simulators and their Application", 5th IFAC Symposium on Automation and Mining, Mineral and Metal Processing, vol. 20, Aug. 31, 1987 (Aug. 31, 1987), pp. 423-428, XP55708868, 001: https://doi.org/10.1016/S1474-6670(17)59130-2.
Extended European Search Report dated Jul. 7, 2020.
International Search Report and Written Opinion and English translation thereof dated May 31, 2018.

* cited by examiner

METHOD AND APPARATUS FOR DETERMINING DATA READING CYCLE

PRIORITY STATEMENT

This application is the national phase under 35 U.S.C. § 371 of PCT International Application No. PCT/CN2017/099539 which has an International filing date of Aug. 29, 2017, which designated the United States of America, the entire contents of which are hereby incorporated herein by reference.

FIELD

Embodiments of the present invention relate generally to the technical field of industrial automation, and in particular, to a method and apparatus for determining a data reading cycle.

BACKGROUND

An industrial control system typically comprises many industrial devices, such as a field device located at an industrial site, and the field device may include: a programmable logic controller (PLC), a data logger, etc. An industrial device may be composed of one or more components. For example, a friction roller may comprise various components such as a rotor, a stator, and a fan. In order to ensure the normal operation of an industrial control system, it is usually necessary to read data from some components in the system, the read data may be a state variable of the component, etc. As an example, it is possible to read a rotational speed of a rotor of a friction roller. As another example, it is also possible to read the temperature of the rotor.

In an industrial control system, the reading and uploading of data from/to an industrial device is usually completed by one or more data gateways (also referred to as assets). The data gateway uploads the read data to a data platform such as an industrial cloud platform, on which various industrial applications can run, and these industrial applications can implement some functions, such as preventive maintenance and device health monitoring, based on the data uploaded to the industrial cloud platform.

Figure 1:
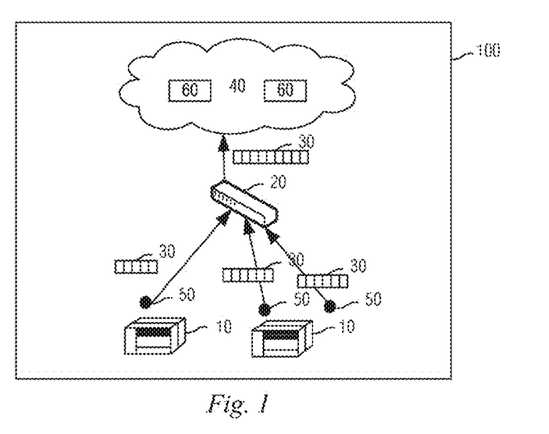
FIG. 1 is a schematic diagram of the acquisition of data from an industrial device in an industrial control system.

FIG. 1 shows an example of an industrial control system 100 reading data from an industrial device 10. As shown in FIG. 1, a data gateway 20 in the industrial control system 100 reads data 30 from each data point 50 of each industrial device 10 and uploads the read data 30 to a Mindsphere platform 40 for use by an industrial application 60.

SUMMARY

The inventors have discovered that typically, the data gateway reads the data at a fixed data reading cycle. If the cycle is too long, the amount of data read is small, and the amount of information is insufficient. If the cycle is too small, a large amount of data is read, but the occupied storage resources, computing resources, transmission resources, etc are too large. Therefore, the inventors have discovered that the setting of this cycle plays an important role in the stable running of the industrial control system.

The inventors have discovered that currently, the data reading cycle is configured by experienced field engineers, but the configuration of the cycle depends on the experience of the field engineer, which makes it difficult to obtain an optimal configuration result, and is time consuming and labor intensive.

In view of this, embodiments of the present invention provide a method and apparatus for determining a data reading cycle, which are used to determine a data reading cycle of data in an industrial control system, and can automatically configure the data reading cycle to obtain a better configuration result.

In a first embodiment, an apparatus for determining a data reading cycle is provided, the apparatus comprising: a feature analysis module for determining a relation between items of data in an industrial control system in a simulation model for the industrial control system, and obtaining timing information of the items of data when the simulation model is running; and a data reading cycle analysis module for determining, according to the relation between the items of data that is determined by the feature analysis module and the timing information of the items of data, a data reading cycle of each of the items of data.

In a second embodiment, a method for determining a data reading cycle is provided, the method comprising: determining a relation between items of data in an industrial control system in a simulation model for the industrial control system; obtaining timing information of the items of data when the simulation model is running; and determining, according to the determined relation between the items of data and the timing information of the items of data, a data reading cycle of each of the items of data.

In a third embodiment, an apparatus for determining a data reading cycle is provided, the apparatus comprising:

at least one memory for storing machine-readable instructions; and at least one processor for invoking the machine-readable instructions to execute the method provided by the second embodiment or any one of possible implementations of the second embodiment.

In a fourth embodiment, a machine-readable medium is provided, wherein the machine-readable medium stores machine-readable instructions thereon, which, when executed by at least one processor, cause the at least one processor to execute the method provided by the second embodiment or any one of possible implementations of the second embodiment.

LIST OF REFERENCE NUMERALS

| | | |
|---|---|---|
| 100: Industrial control system | 200: Apparatus for determining data reading cycle | 300: Simulation software |
| 400: Automation software | 500: Field configuration data | |
| 10: Industrial device | 20: Data gateway | 30: Data |
| 40: Industrial cloud platform | 50: Data point | 60: Industrial application |
| 11: Simulation model | 12: Simulation data | 13: Instance model |
| 14: Data group | 15: Data feature | 16: Simulated data reading cycle |
| 17: Mapping relation | 18: Instance data reading cycle | 19: Adjusted data reading cycle |
| 2001: Data grouping module | 2002: Feature analysis module | 2002a: Relation extraction module |
| 2002b: Timing information acquisition module | 2003: Data reading cycle analysis module | 2004: Data mapping module |
| 2005: Cycle configuration module | | |
| 111: Track | 112: Friction roller (roller, driven by a motor) | 112(1): Friction roller 1 |
| 112(2): Friction roller 2 | 112(3): Friction roller 3 | PS0: Proximity switch 0 |
| PS1A: Proximity switch 1A | PS1B: Proximity switch 1B | PS2A: Proximity switch 2A |
| PS2B: Proximity switch 2B | PS3A: Proximity switch 3A | PS3B: Proximity switch 3B |
| PS4: Proximity switch 4 | | |
| 14(1): Data group 1 | 14(2): Data group 2 | 14(3): Data group 3 |
| 2006: At least one memory | 2007: At least one processor | 2008: User interface |
| 2009: Communication interface | | |
| S501: Data group | S502: Feature analysis | S503: Cycle analysis |
| S504: Data mapping | S505: Cycle configuration | S506: Cycle adjustment |
| S601: Acquire a simulation model | S602: Data group | S603: Acquire a simulation model |
| S604: Acquire simulation data | S605: Acquire a data group | S606: Extract a relation between items of data |
| S607: Extract a data feature 15 | S608: Set a description of the data feature | S609: Determine a simulated data reading cycle |
| S610: Set a data reading cycle | | S611: Acquire a mapping relation |
| S612: Acquire a simulation model | S613: Acquire an instance model | S614: Perform data mapping |
| S615: Set the mapping relation | S616: Generate an instance data reading cycle | |
| S617: Set the data reading cycle | S618: Analyze the required data reading cycle | |
| S619: Adjust the data reading cycle | | |

DETAILED DESCRIPTION OF EMBODIMENTS

In a first embodiment, an apparatus for determining a data reading cycle is provided, the apparatus comprising: a feature analysis module for determining a relation between items of data in an industrial control system in a simulation model for the industrial control system, and obtaining timing information of the items of data when the simulation model is running; and a data reading cycle analysis module for determining, according to the relation between the items of data that is determined by the feature analysis module and the timing information of the items of data, a data reading cycle of each of the items of data.

The automatic configuration of the data reading cycle is realized by extracting a data feature of the industrial control system and determining the data reading cycle according to the extracted data feature.

Optionally, the simulation model is used for simulating the industrial control system that is in a particular state.

The industrial control system in a specific state is simulated, and a data feature of the industrial control system in this state is extracted, such that the data reading cycle determined thereby has the feature of the specific state, and can be used for analyzing the industrial control system in this specific state.

Optionally, the apparatus further comprises a data grouping module for grouping the items of data, wherein upon obtaining the timing information of the items of data, the feature analysis module is specifically used for determining, for each group of data grouped by the data grouping module, timing information of the group of data respectively; and the data reading cycle analysis module is specifically used for determining, for each group of data obtained by grouping, a data reading cycle of the group of data according to the determined timing information of the group of data.

Before analyzing the timing information, the items of data are grouped, and the same data reading cycle is determined for the same group, to facilitate the subsequent analysis of the data in the same group.

Optionally, the data grouping module is specifically used for: grouping the same type of data into one group; or grouping the data generated by components in the industrial control system that belong to one and the same template into one group, wherein the template is used for defining a set of components in one industrial control system and the relation between the components in the set, and the template is reusable, or grouping the logically interrelated data in the industrial control system into one group.

Here, different grouping methods are provided.

Optionally, the data reading cycle analysis module is specifically used for determining the data reading cycle, such that an industrial application implemented according to the read items of data satisfies requirements of the industrial application.

The data reading cycle is determined according to requirements of a particular industrial application, and the read data can therefore better realize functions of the industrial application.

Optionally, the apparatus further comprises a data mapping module for determining identifiers of the items of data in an instance model for the industrial control system, determining identifiers of the items of data in the simulation model, and determining, for each of the items of data, a mapping relation between an identifier of the data in the instance model and an identifier of the data in the simulation model. The apparatus further comprises further comprises a cycle configuration module for configuring, for each of the items of data and according to the mapping relation and the data reading cycle of the item of data, a data reading cycle of the item of data in the industrial control system.

The setting of the data reading cycle of the actual industrial control system is realized by means of the data mapping described above.

In a second embodiment, a method for determining a data reading cycle is provided, the method comprising: determining a relation between items of data in an industrial control system in a simulation model for the industrial control system; obtaining timing information of the items of data when the simulation model is running; and determining, according to the determined relation between the items of data and the timing information of the items of data, a data reading cycle of each of the items of data.

The automatic configuration of the data reading cycle is realized by extracting a data feature of the industrial control system and determining the data reading cycle according to the extracted data feature.

Optionally, the simulation model is used for simulating the industrial control system that is in a particular state.

The industrial control system in a specific state is simulated, and a data feature of the industrial control system in this state is extracted, such that the data reading cycle determined thereby has the feature of the specific state, and can be used for analyzing the industrial control system in this specific state.

Optionally, the method further comprises: grouping the items of data; determining, for each group of data obtained by grouping, timing information of the group of data respectively; and determining, for each group of data obtained by grouping, a data reading cycle of the group of data according to the determined timing information of the group of data.

Before analyzing the timing information, the items of data are grouped, and the same data reading cycle is determined for the same group, to facilitate the subsequent analysis of the data in the same group.

Optionally, the same type of data is grouped into one group; or grouping the data generated by components in the industrial control system that belong to one and the same template into one group, wherein the template is used for defining a set of components in one industrial control system and the relation between the components in the set, and the template is reusable, or grouping the logically interrelated data in the industrial control system into one group.

Here, different grouping methods are provided.

Optionally, the data reading cycle is determined such that an industrial application implemented according to the read items of data satisfies requirements of the industrial application.

The data reading cycle is determined according to requirements of a particular industrial application, and the read data can therefore better realize functions of the industrial application.

Optionally, the method further comprises: determining identifiers of the items of data in an instance model for the industrial control system; determining identifiers of the items of data in the simulation model; determining, for each of the items of data, a mapping relation between an identifier of the data in the instance model and an identifier of the data in the simulation model; and configuring, according to the mapping relation and the data reading cycle of the item of data, a data reading cycle of the item of data in the industrial control system.

The setting of the data reading cycle of the actual industrial control system is realized by means of the data mapping described above.

In a third embodiment, an apparatus for determining a data reading cycle is provided, the apparatus comprising:

at least one memory for storing machine-readable instructions; and at least one processor for invoking the machine-readable instructions to execute the method provided by the second embodiment or any one of possible implementations of the second embodiment.

In a fourth embodiment, a machine-readable medium is provided, wherein the machine-readable medium stores machine-readable instructions thereon, which, when executed by at least one processor, cause the at least one processor to execute the method provided by the second embodiment or any one of possible implementations of the second embodiment.

As previously mentioned, the configuration of a data reading cycle of an industrial device plays an important role in the stable operation of the industrial control system to which the industrial device belongs. The method of manually configuring the cycle by a field engineer depends on the experience of the field engineer, which makes it difficult to get the optimal configuration results, and is time consuming and labor intensive.

In an embodiment of the present invention, an industrial control system in different states is simulated by using simulation software to obtain a simulation model and simulation data, data features (i.e., the relation between items of data and timing information of the data) of the simulated industrial control system in the different states are extracted respectively, and the data reading cycle is determined according to the extracted data features.

Optionally, the data reading cycle may be determined while considering the requirement of a specific data service (e.g., preventive maintenance) realized by the data, and the determined data reading cycle needs to meet the requirement to support the data service.

Optionally, the data to be read may be grouped according to the relation between the items of data in advance, for example, the same type of data is grouped into one group, or the data generated by components belonging to one and the same predefined template is grouped into one group, or alternatively, the logically interrelated data is grouped into one group. For each group of data, the timing information of the group of data is respectively determined and the same data reading cycle is determined. This can reduce the amount of data to be read without affecting the support of the data service, so that the read data can reflect an event occurring in the industrial control system.

Optionally, an instance model for the industrial control system may be obtained from the automation software or the field configuration data, and the identifier of the data in the instance model is mapped with the identifier of the data in the simulation model, thereby configuring the data reading cycle of the data in the industrial control system according to the obtained mapping relation and the data reading cycle determined for the data in the simulation model.

Optionally, the determined data reading cycle may be adjusted based on the feedback from an industrial application to achieve an optimal configuration of the data reading cycle.

The method and the device provided in the embodiments of the present invention are described in detail below with reference to the accompanying drawings.

Figure 2:
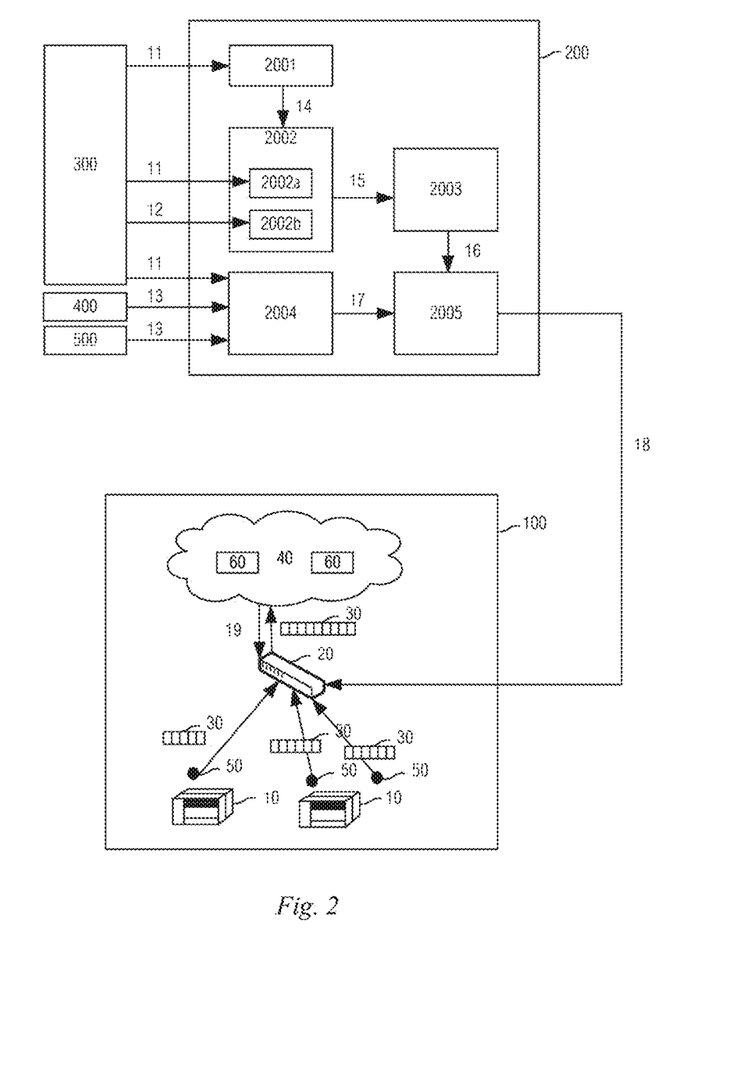
FIG. 2 is a schematic diagram of the operating principle of an apparatus for determining a data reading cycle provided in an embodiment of the present invention.

FIG. 2 is a schematic diagram of an operation principle of an apparatus 200 for determining a data reading cycle provided in an embodiment of the present invention. As shown in FIG. 2, the apparatus 200, on one hand, acquires a simulation model 11 and simulation data 12 from simulation software 300, and acquires an instance model 13 from automation software 400 and field configuration data 500; and on the other hand, generates an instance data reading cycle 18 and configures the instance data reading cycle 18 on a data gateway 20.

The apparatus 200 may comprise a feature analysis module 2002 and a data reading cycle analysis module 2003. In addition, the apparatus may further comprise a data grouping module 2001, a data mapping module 2004, and a cycle configuration module 2005. The operation principle of the apparatus 200 will be described in conjunction with FIG. 2.

1) Data Grouping Module 2001

The data grouping module 2001 is used for grouping items of data 30 in an industrial control system 100.

The data grouping module 2001 acquires the simulation model 11 from the simulation software 300. The simulation software 300 may be a product lifecycle management (PLM) simulation software in different fields, such as a multi-domain mechatronics system simulation platform (Imagine Lab Amesim, LMS), and Process Simulate. The simulation software 300 can provide sufficient simulation models 11. A simulation model 11 may be a text file which indicates that an industrial control system 100 comprises individual components.

The data grouping module 2001 can perform data grouping based on a data mining technique. As an example: key components and data may be simulated in the LMS, and interrelated components may be assigned to one group, and data 30 of components belonging to the same group may be grouped into one group. The data grouping module 2001 finally obtains a data group 14, i.e., grouping information of the data 30. The data group 14 may be a list including at least one group, wherein one group comprises an item of data 30 or a plurality of items of data 30.

Optionally, the data grouping module 2001 may group the data 30 as follows:

Mode I: grouping the same type of data 30 into one group;

Mode II: grouping the data 30 generated by components belonging to one and the same template in the industrial control system 100 into one group, wherein one template is used for defining a set of components in an industrial control system 100 and a relation between the components in the set and can be reused; and Mode III: grouping the logically interrelated data 30 in the industrial control system 100 into one group, that is, the data 30 belonging to one and the same logic block is grouped into one group.

Figure 3:
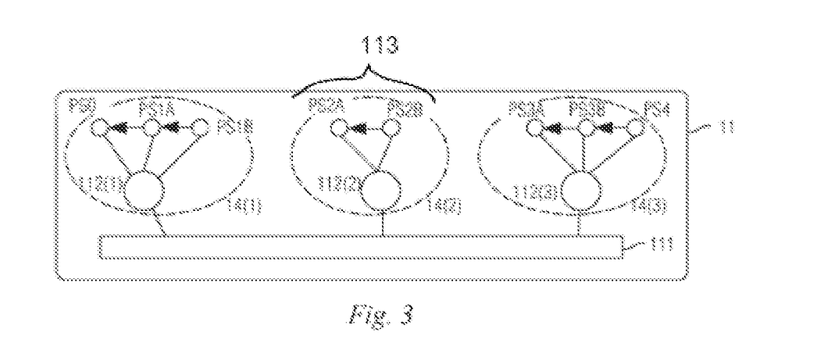
FIG. 3 is a schematic diagram of the grouping of data in an embodiment of the present invention.

FIG. 3 is a schematic diagram of the grouping of data in an embodiment of the present invention. In FIG. 3, according to a simulation model 11, a track 111 is connected to three friction rollers 112, which are respectively a friction roller 1, i.e. 112(1) in the figure, a friction roller 2, i.e. 112(2) in the figure, and a friction roller 3, i.e. 112(3) in the figure. Each of the friction rollers is connected to other components 113. As an example: the friction roller 1 is connected to the components 113(1), 113(2) and 113(3). The components connected to a line without a arrow in the figure have a connection relation therebetween. Between the components connected by a line with an arrow, the component pointed to by the arrow acts after the component from which the arrow originates. In FIG. 3, components in a dashed box belong to the same logic block or logic chain, and are grouped into one group. There are three groups in FIG. 3: group 14(1), group 14(2), and group 14(3).

2) Feature Analysis Module 2002

The feature analysis module 2002 is used for analyzing the feature of the data 30, i.e., the data feature 15, which may include:

the relation between the items of data 30, and the timing information of each item of data 30, wherein the timing information is used for indicating the time condition satisfied between the items of data 30.

The feature analysis module 2002 may comprise two sub-modules, namely a relation extraction module 2002a and a timing information acquisition module 2002b, respectively.

The relation extraction module 2002a extracts the relation between the items of data 30 in the industrial control system 100 from the simulation model 11. As an example: the formulas satisfied between the items of data 30 may be extracted from the LMS, and the logical relation between the items of data 30 may be extracted from Process Simulate. The extracted relation between the items of data 30 may be used for reducing the amount of data identification and data transmission. As an example: the speed is equal to the distance divided by the time, if the distance and the time have been obtained, the speed can be obtained by calculation and there is no need to obtain the speed data.

The timing information acquisition module 2002b may extract, from the simulation data 12, timing information of the items of data 30 when the simulation model 11 is running. The simulation data 12 comes from the simulation software 300 and may include a time point and duration of occurrence of an item of data 30, that is, timing information. Optionally, the timing information acquisition module 2002b may respectively extract the timing information for each group obtained by the data grouping module 2001, because the data reading cycles of the items of data 30 in the same group are the same, which facilitates analysis of the data 30 in the same group.

The data features 15 obtained by the feature analysis module 2002 can be described by using a formula or an algorithm. An example is as follows:

Data feature description (timing information description)

For Spring Loose Failure (for a spring loose failure):

1) Timespan(PS2B_end-PS2A_end)>0 (the second group of friction rollers, the time point at which a proximity switch PS2B changes from "closed" to "opened" is later than the time point at which a proximity switch PS2A changes from "closed" to "opened")

2) Timespan(PS2B_start-PS2A_start)>0 (the second group of friction rollers, the time point at which the proximity switch PS2B changes from "opened" to "closed" is later than the time point at which the proximity switch PS2A changes from "opened" to "closed")

3) Timespan(PS2A_fail=1)>Timespan(PS2A=1) (the second group of friction rollers, the duration during which the proximity switch PS2A is "closed" in a failed state is longer than the duration during which it is "closed" in the normal state)

4) Timespan (PS2A=1)=2 s (the second group of friction rollers, the duration during which the proximity switch PS2A is "closed" in the normal state is 2 s)

5) Timespan (PS2A_fail=1)>3 s (the second group of friction rollers, the duration during which the proximity switch PS2A is "closed" in the failed state is more than 3 s)

Variable relation description (description of the relation between items of data)

1) Motor1_Rolling=PS1A||PS1B (used for indicating the relation between three items of data, namely Motor1_Rolling, PS1A and PS1B, where Motor1_Rolling indicates the rotation of the first group of friction rollers, PS1A indicates that the proximity switch PS1A is closed, PS1B indicates that the proximity switch PS1B is closed, and || indicates the relation "or". The entire formula indicates that when either one of the proximity switch PS1A and PS1B is closed, the first group of friction rollers rotate)

2) Motor2_Rolling=PS2A||PS2B (used for indicating that when either one of the proximity switch PS2A or PS2B is closed, the second group of friction rollers rotate)

3) Data Reading Cycle Analysis Module 2003

The data reading cycle analysis module 2003 is used for determining a data reading cycle of each item of data 30 according to the relation between the items of data 30 in the industrial control system 100 determined by the feature analysis module 2002 and the timing information of the items of data 30. Optionally, if the items of data 30 are grouped by the data grouping module 2001 in advance, the data reading cycle analysis module 2003 may determine a data reading cycle for each group of data 30, that is, for the data 30 within the same group, the same data reading cycle is used for data reading.

Optionally, the data reading cycle analysis module 2003 makes it possible for an industrial application 60 realized according to the read items of data 30 to satisfy the requirements of the industrial application 60 when determining the data reading cycle. In this way, the data 30 read by using the determined data reading cycle can better support the requirements of the industrial application 60.

4) Data Mapping Module 2004

The data mapping module 2004 is used for determining identifiers of items of data 30 in an instance model 13 of the industrial control system 100, determining identifiers of items of data 30 in the simulation model 11, and for each of the items of data 30, determining the mapping relation between the identifier of the data 30 in the instance model 13 and the identifier of the data 30 in the simulation model 11.

An instance model for an industrial control system may come from software used by the industrial control system, such as TIA portal software, and PCS7, or from another software that can commonly create a instance model. In this type of software, an instance model can be obtained and used for the mapping of data from the simulation model to the instance model.

The mapping relation 17 between the identifier of the data 30 in the instance model 13 and the identifier of the data 30 in the simulation model 11 determined by the data mapping module 2004 may be described with reference to the following:

Variable mapping (mapping relations)
PS0->DB0.I0.0
PS1A->DB0.I1.0
PS1B->DB0.I2.0
PS2A->DB0.I3.0
PS2B->DB0.I4.0
PS3A->DB0.I5.0
PS3B->DB0.I6.0
PS4->DB0.I7.0
Motor1 Rolling->DB3.I1.0
Motor2 Rolling->DB3.I2.0
Motor3 Rolling->DB3.I3.0

In the above mapping relations 17, before the arrow is the identifier of the data 30 in the simulation model 11 (here, the name of the data 30 in the simulation model 11), and behind the arrow is the identifier of the data 30 in the instance model 13 (here, the address of the data 30 in the instance model 13).

5) Cycle Configuration Module 2005

The cycle configuration module 2005 is used for configuring, for each of the items of data 30, the data reading cycle of the item of data 30 in the industrial control system 100 according to the mapping relation 17 determined by the data mapping module 2004 and the data reading cycle of the item of data 30. The cycle configuration module 2005 may generate the instance data reading cycle 18 according to the mapping relation 17 and the simulated data reading cycles 16 of the items of data 30 output by the data reading cycle analysis module 2003, and send the instance data reading cycle 18 to the data gateway 20. The data gateway 20 reads the items of data 30 according to the received data reading cycles 18, thereby enabling the configuration of the data reading cycles.

Optionally, if the items of data 30 have been grouped by the data grouping module 2001, the data reading cycles are set by groups, and the items of data 30 in the same group have the same data reading cycle.

The data reading cycle 18 may be described with reference to the following:

Reading Cycle (Data Reading Cycle)
1) Group1: ReadingCycle=200 ms (group 1: data reading cycle is 200 ms)
Name=PS0, Address=DB0.I0.0 (the name of the data 30 is PS0, and the address thereof is DB0.I0.0)
Name=PS1A, Address=DB0.I1.0 (the name of the data 30 is PS1A, and the address thereof is DB0.I1.0)
Name=PS1B, Address=DB0.I2.0 (the name of the data 30 is PS1B, and the address thereof is DB0.I2.0)
2) Group2: ReadingCycle=200 ms (group 2: data reading cycle is 200 ms)
Name=PS2A, Address=DB0.I3.0 (the name of the data 30 is PS2A, and the address thereof is DB0.I3.0)
Name=PS2B, Address=DB0.I4.0 (the name of the data 30 is PS2B, and the address thereof is DB0.I4.0)
3) Group3: ReadingCycle=200 ms (group 3: data reading cycle is 200 ms)
Name=PS3A, Address=DB0.I5.0 (the name of the data 30 is PS3A, and the address thereof is DB0.I5.0)
Name=PS3B, Address=DB0.I6.0 (the name of the data 30 is PS3B, and the address thereof is DB0.I6.0)
Name=PS4, Address=DB0.I7.0 (the name of the data 30 is PS4, and the address thereof is DB0.I7.0)

In the above description, the data reading cycles are given by groups, and for each group, the data reading cycle, the name of the data 30 in the simulation model 11, and the address thereof in the instance model 13 are given.

The data gateway 20 sends the read data 30 to the industrial cloud platform 40 for use by various industrial applications 60 on the industrial cloud platform 40. After the industrial applications 60 use the received data 30, the data reading cycle can be adjusted according to the usage, for example: it can be seen that the adjusted data reading cycles 19 for some of the data 30 are sent to the data gateway 20 or cycle adjustment instructions for some of the data 30 are sent to the data gateway 20. The data gateway 20 reads the data 30 according to the adjusted data reading cycle 19.

The data grouping module 2001, the feature analysis module 2002, and the data mapping module 2004 described above all use the simulation model 11 when processing. Therefore, the use of the simulation software 300 and the simulation model 11 plays an important role in determining the data reading cycle. In an embodiment of the present invention, the simulation software 300 and the simulation model 11 can simulate the industrial control system 100 in various specific states according to the requirements of the industrial application 60. As an example: the industrial control system 100 is simulated in which all the industrial devices 10 are in the normal state.

As another example: the industrial control system 100 is simulated in which one or some of the industrial devices 10 or some components of an industrial device 10 are in the failed state. A data feature 15 of each item of data 30 in the industrial control system 100 in a particular state is obtained, and a data reading cycle is determined according to the extracted data feature 15 reflecting the particular state of the industrial control system 100, and the data reading cycle is used for reading data, and the data 30 reflecting the specific state of the industrial control system 100 can be efficiently acquired, which is advantageous for accurately implementing the industrial application 60.

Figure 4:
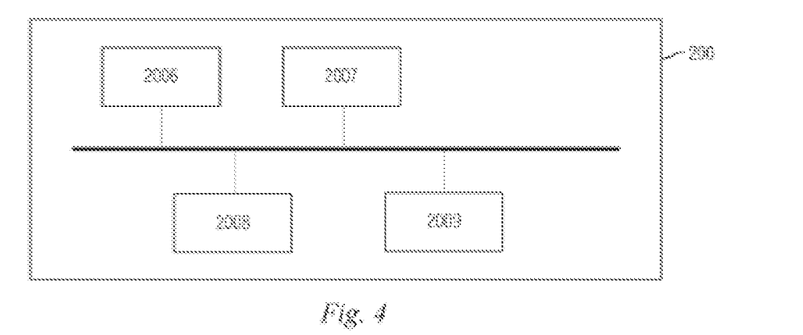
FIG. 4 is a schematic diagram of an implementation of an apparatus for determining a data reading cycle provided in an embodiment of the present invention.

FIG. 4 is a schematic diagram of an implementation of the apparatus 200. The apparatus 200 may comprise:

at least one memory 2006 for storing machine-readable instructions; and at least one processor 2007 for invoking the machine-readable instructions to realize the functions of the apparatus 200 in any of the embodiments of the present invention.

The structure shown in FIG. 4 can be regarded as a hardware implementation of the structure shown in FIG. 2. The feature analysis module 2002, the data reading cycle analysis module 2003, the data grouping module 2001, the data mapping module 2004, and the cycle configuration module 2005 can all be regarded as part of the above machine-readable instructions, and are stored in at least one memory 2006, and at least one processor 2007 is used for invoking the instructions in each of the above modules to realize the functions of the apparatus 200.

In addition, the apparatus 200 may further comprise a user interface 2008 for realizing interaction with a user, such as interaction with an operation and maintenance personnel. When the apparatus 200 needs to communicate messages with other devices, the apparatus 200 may further comprise at least one communication interface 2009, e.g. communication with simulation software 300, automation software 400, field configuration data 500 or the data gateway 20.

The various constituent parts in FIG. 4 may be connected by means of a bus to enable the message communication between the constituent parts.

The apparatus 200 provided in the embodiment of the present invention may be a part of the industrial control system 100 or may be implemented independently of the industrial control system 100.

Figure 5:
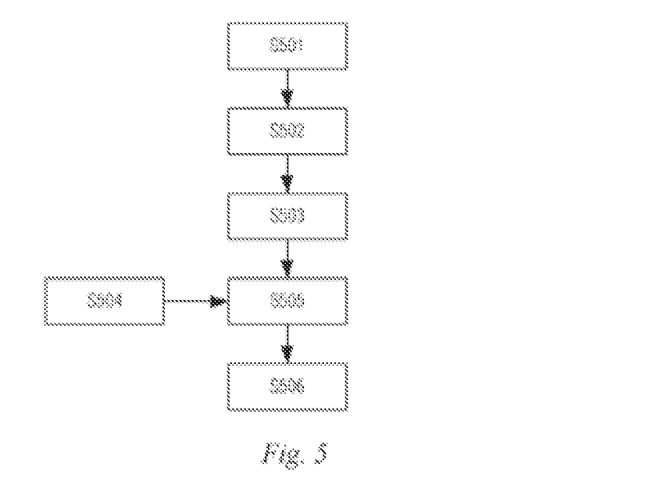
FIG. 5 is a flowchart of a method for determining a data reading cycle provided in an embodiment of the present invention.

FIG. 5 is a flowchart of a method for determining a data reading cycle provided in an embodiment of the present invention. The method may be implemented by the apparatus 200. As shown in FIG. 5, the method may comprise the following steps:

S501: Data Grouping

In step S501, items of data 30 in the industrial control system 100 are grouped. As an example: the same type of data 30 may be grouped into one group. As another example: the data 30 generated by components belonging to one and the same template in the industrial control system 100 is grouped into one group. For another example: the logically interrelated data 30 in the industrial control system 100 is grouped into one group.

S502: Feature Analysis

In step S502, for each group of the data 30 obtained by grouping in step S501, timing information of the group of data 30 is determined. Moreover, the relation between the items of data 30 is determined. The obtained timing information and relation between the items of data 30 are taken as the data features 15 of the items of data 30 in the industrial control system 100.

S503: Cycle Analysis

In step S503, a data reading cycle of each of the items of data 30 is determined according to the determined relation between the items of data 30 and the timing information of the items of data 30. For each group of data 30 obtained by grouping, the data reading cycle of the group of data 30 is determined according to the determined timing information of the group of data 30. Optionally, the determined data reading cycle should satisfy the following: an industrial application 60 realized according to the read items of data 30 satisfies the requirements of the industrial application 60.

S504: Data Mapping

In step S504, a mapping relation 17 between the identifier of an item of data 30 in the instance model 13 and an identifier of the item of data 30 in the simulation model 11 is determined.

S505: Cycle Configuration

In step S505, the data reading cycle of the item of data 30 in the industrial control system 100 is configured according to the mapping relation determined in step S504 and the data reading cycle of the item of data 30.

S506: Cycle Adjustment

The data gateway 20 reads the data 30 with the data reading cycle configured in step S505, and sends the read data to the industrial cloud platform 40 for use in various industrial applications 60 on the industrial cloud platform 40. After the industrial applications 60 use the received data 30, the data reading cycle can be adjusted according to the usage, for example: it can be seen that the adjusted data reading cycles 19 for some of the data 30 are sent to the data gateway 20 or cycle adjustment instructions for some of the data 30 are sent to the data gateway 20. The data gateway 20 reads the data 30 according to the adjusted data reading cycle 19.

Other optional implementations of the method may be combined with FIG. 1 to FIG. 4 and the foregoing description of the apparatus 200, and details are not described herein again.

Figure 6:
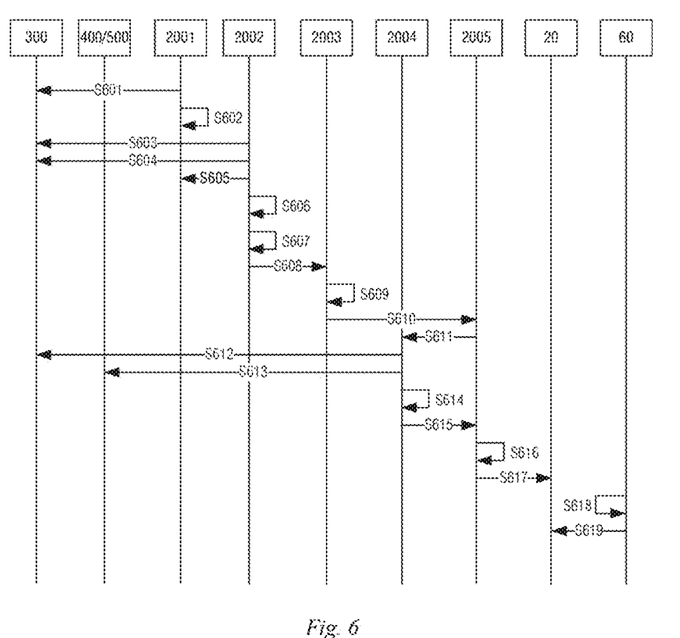
FIG. 6 is another flowchart of the method for determining a data reading cycle provided in the embodiment of the present invention.

FIG. 6 is another flowchart of the method for determining a data reading cycle provided in the embodiment of the present invention. FIG. 5 describes a process flow of the apparatus 200. FIG. 6 illustrates the method for determining a data reading cycle provided in an embodiment of the present invention in conjunction with the interaction of the apparatus 200 with another apparatus. As shown in FIG. 6, the interaction flow comprises the following steps:

S601: a data grouping module 2001 acquires a simulation model 11 from simulation software 300, and this step may be implemented by AcquireSimulationModel( ).

S602: a data grouping module 2001 performs data grouping. The data grouping module 2001 extracts information of data groups 14 of items of data 30 in an industrial control system 100 from the simulation model 11. This step may be implemented by ExtractVariableGroupingInfo( ).

S603: a feature analysis module 2002 acquires the simulation model 11 from the simulation software 300, and this step may be implemented by AcquireSimulationModel( ).

S604: the feature analysis module 2002 acquires simulation data 12 from the simulation software 300, and this step may be implemented by AcquireSimulationDataSet( ).

S605: the feature analysis module 2002 acquires information of the data groups 14 from the data grouping module 2001. This step may be implemented by GetVariable Groups( ).

S606: the feature analysis module 2002 mines the relation between the items of data 30 from the simulation model 11. This step may be implemented by ExtractVariable Relation( ).

S607: the feature analysis module 2002 mines the timing information of each group of data grouped by the data grouping module 2001 from the simulation data 12. This step may be implemented by ExtractDataFeature( ).

S608: the feature analysis module 2002 sets the obtained data features 15 (comprising the relation between the items of data and the timing information of each group of data) for the data reading cycle analysis module 2003. This step may be implemented by SetDataFeatureDesc( ).

S609: the data reading cycle analysis module 2003 determines the simulated data reading cycle 16 based on the data features 15 and the information of the data groups 14. This step may be implemented by CalculateReadingCycle( ).

S610: the data reading cycle analysis module 2003 sets the determined simulated data reading cycle 16 for the cycle configuration module 2005. This step may be implemented by SetSimulationReadingCycle( ).

S611: the cycle configuration module 2005 acquires the mapping relation 17 from the data mapping module 2004. This step may be implemented by AcquireVariable Mapping( ).

S612: the data mapping module 2004 acquires the simulation model 11 of the industrial control system 100 from the simulation software 300. This step may be implemented by AcquireSimulationModel( ).

S613: the data mapping module 2004 acquires an instance model 13 of the industrial control system 100 from automation software 400 and/or field configuration data 500. This step may be implemented by AcquireInstanceModel( ).

S614: the data mapping module 2004 performs data mapping to determine a mapping relation 17 between the identifier of the data 30 in the instance model 13 and the identifier of the data 30 in the simulation model 11. This step may be implemented by DoVariableMapping( ).

S615: the data mapping module 2004 sets the mapping relation 17 for the cycle configuration module 2005. This step may be implemented by SetVariableMapping( ).

S616: the cycle configuration module 2005 changes the simulated data reading cycle 16 into the instance data reading cycle 18 according to the mapping relation 17. This step may be implemented by GenerateInstanceReadingCycle( ).

S617: the cycle configuration module 2005 configures the instance data reading cycle 18 for the data gateway 20. The cycle configuration module 2005 may set the instance data reading cycle 18 for a configuration application in the industrial application 60 running on the industrial cloud platform 40. The data gateway 20 reads the instance data reading cycle 18 from the configuration application. The cycle configuration service is to set the cycle. This step may be implemented by SetReadingCycleConfig( ).

S618: the industrial application 60 analyzes the data reading cycle required for realizing its own function. This step may be implemented by AnalyzeNeededReading Cycle( ). This step may be executed before or after the reading of the data 30.

S619: the industrial application 60 adjusts the data reading cycle of the data gateway 20. This step may be implemented by AdjustReadingCycleConfig( ).

Figure 7:
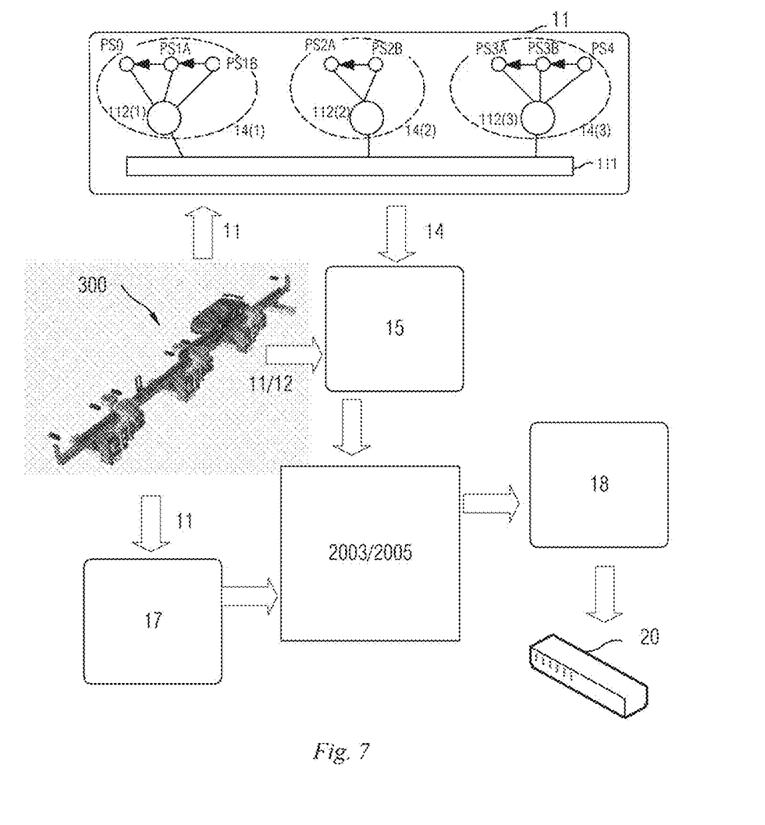
FIG. 7 is a schematic diagram of a process of configuring the data reading cycle in an embodiment of the present invention.

FIG. 7 is a schematic diagram of a process of configuring the data reading cycle in an embodiment of the present invention. In FIG. 7, the simulation software 300 provides a simulation model 11 and simulation data 12, and extracts information of data groups 14 from the simulation model 11. The data feature 15 is obtained from the simulation model 11 and the simulation data 12 by means of the information of the data groups 14. The mapping relation 17 is obtained from the simulation model 11. The data reading cycle analysis module 2003 and the cycle configuration module 2005 obtain the instance data reading cycle according to the mapping relation 17 and the data feature 15 and finally configures the instance data reading cycle on the data gateway 20.

Based on the same technical concept, an embodiment of the present invention also provides a machine-readable medium storing machine-readable instructions for causing a machine to perform the aforementioned method herein. Specifically, a system or an apparatus with a machine-readable medium may be provided, and software program codes for implementing the functions of any one of the embodiments described above are stored on the machine-readable medium, and a computer (or a central processing unit (CPU) or a micro processor unit (MPU)) of the system or the apparatus reads and executes the program codes stored in the storage medium.

In this condition, the program codes per se read from the storage medium may implement the functions of any one of the embodiments described above, and therefore the program codes and the storage medium storing the program codes constitute a part of the embodiment of the present invention.

Embodiments of the storage medium for providing program codes include a floppy disk, a hard disk, a magneto-optical disk, an optical disc (such as a Compact Disc Read-Only Memory (CD-ROM), a Compact Disc-Recordable (CD-R), a Compact Disc-ReWritable (CD-RW), a Digital Video Disc-Read Only Memory (DVD-ROM), a Digital Versatile Disc-Random Access Memory (DVD-RAM), and a Digital Versatile Disc±ReWritable (DVD±RW)), a magnetic tape, a non-volatile memory card, and a Read-Only Memory (ROM). Optionally, the program codes may be downloaded from a server computer or a cloud via a communication network.

In addition, it should be clear that an operating system operating on a computer may accomplish some or all of the actual operations not only by executing the program codes read out by the computer, but also based on an instruction of the program codes, thereby implementing the functions of any one of the embodiments described above.

In addition, it will be understood that the program codes read out from the storage medium are written into a memory provided in an expansion board inserted into the computer or written into a memory provided in an expansion unit connected to the computer, then a CPU installed on the expansion board or the expansion unit executes some or all of the actual operations based on an instruction of the program codes, thereby implementing the functions of any one of the embodiments described above.

It should be noted that not all the steps and modules in the flows and structural diagrams of the devices described above are necessary, and some steps or modules may be omitted according to practical requirements. The execution order of the various steps is not fixed and may be adjusted according to requirements. The device structure described in the various embodiments above may be a physical structure and may also be a logical structure, i.e. some modules may be implemented by the same physical entity, or some modules may be implemented separately by a plurality of physical entities, or may be implemented together by some components in a plurality of independent devices.

In the various embodiments above, a hardware unit may be implemented mechanically or electrically. As an example, a hardware unit may comprise a permanent dedicated circuit or logic (such as a dedicated processor, FPGA or ASIC) to accomplish a corresponding operation. The hardware unit may also comprise a programmable logic or circuit (such as a general-purpose processor or other programmable processors), and may be set temporarily by hardware to accomplish a corresponding operation. The specific implementation method (mechanically, or a dedicated permanent circuit, or a temporarily set circuit) may be determined in consideration of cost and time.

The present invention is illustrated and described in detail above by means of drawings and preferred embodiments; however, the present invention is not limited to these disclosed embodiments. Based on the multiple embodiments described above, those skilled in the art would know that code checking means in the above different embodiments may be combined to obtain more embodiments of the present invention, and these embodiments also fall within the scope of protection of the present invention.

The invention claimed is:

1. An apparatus for determining a data reading cycle, comprising:
   a memory storing program computer-readable instructions; and
      one or more processors configured to execute the instructions such that the one or more processors are configured to,
      receive a simulation model and simulation data;
      determine a relation between items of the simulation data in an industrial control system in the simulation model for the industrial control system, and to obtain timing information of the items of simulation data when the simulation model is running;
      determine, according to the relation between the items of simulation data and the timing information of the items of data, a data reading cycle of each of the items of data; and
      group the items data,
      wherein upon obtaining the timing information of the items of data, determine, for each group data, respective timing information of each group of data, respectively; and determine, for each group of data obtained by grouping, a data reading cycle of each group of data, respectively, according to the respective timing information of the group of data respectively determined, and
      group a same type of date into one group, or
      group data generated by components in the industrial control system that belong to a same template into one group, wherein the same template is used for defining a set of components in one industrial control system and a relation between the components in the set, and wherein the same template is reusable, or
      group logically interrelated data in the industrial control system into one group.

2. The apparatus of claim 1, wherein the simulation model is used for simulating the industrial control system in a particular state.

3. The apparatus of claim 1, wherein the one or more processors are configured to:
   determine the data reading cycle, such that an industrial application, implemented according to read items of data, satisfies requirements of the industrial application.

4. The apparatus of claim 1, further comprising:
   a data mapping module configured to:
   determine identifiers of the items of data in an instance model for the industrial control system,
   determine identifiers of the items of data in the simulation model, and
   determining, for each of the items of data, a mapping relation between an identifier of the data in the instance model and an identifier of the data in the simulation model; and
   a cycle configuration module to configure, for each respective one of the items of data and according to the mapping relation and the data reading cycle of the item of data, a data reading cycle of the item of data in the industrial control system, respectively.

5. A method for determining a data reading cycle, comprising:
   determining a relation between items of data in an industrial control system in a simulation model for the industrial control system;
   obtaining timing information of the items of data when the simulation model is running;
   determining, according to the relation determined between the items of data and the timing information of the items of data obtained, a data reading cycle of each of the items of data;
   grouping the items of data; wherein
      the obtaining of the timing information of the items of data includes;
      determining, for each group of data obtained by grouping, timing information of the group of data, respectively; and
      the determining a data reading cycle of each of the items of data includes; determining, for each group of data obtained by grouping, a data reading cycle of the respective group of data according to respective timing information of the group of data determined, wherein the grouping of the items of data includes;
   grouping a same type of data into one group, or
   grouping data generated by components in the industrial control system that belong to a same template into one group, wherein the same template is used for defining a set of components in one industrial control system and the relation between the components in the set, and the same template is reusable, or
   grouping logically interrelated data in the industrial control system into one group.

6. The method of claim 5, wherein the simulation model is used for simulating the industrial control system in a particular state.

7. The method of claim 5, wherein the determining of a respective data reading cycle of each of the respective items of data includes:
   determining the respective data reading cycle, such that an industrial application implemented according to the read items of data satisfies requirements of the industrial application.

8. The method of claim 5, further comprising:
determining identifiers of the items of data in an instance model for the industrial control system;
determining identifiers of the items of data in the simulation model;
for each of the items of data,
determining a mapping relation between an identifier of the respective item of data in the instance model and a respective identifier of the respective item of data in the simulation model; and
configuring, according to the mapping relation determined and the data reading cycle of the respective item of data, a data reading cycle of the respective item of data in the industrial control system.

9. An apparatus for determining a data reading cycle, comprising:
at least one memory for storing machine-readable instructions; and
at least one processor, configured to invoke the machine-readable instructions to execute, to determine a data reading cycle,
determining a relation between items of data in an industrial control system in a simulation model for the industrial control system;
obtaining timing information of the items of data when the simulation model is running;
determining, according to the relation determined between the items of data and the timing information of the items of data obtained, a data reading cycle of each of the items of data, and
grouping the items of data,
wherein upon obtaining the timing information of the items of data, determining, for each group of data, respective timing information of each group of data, respectively; and determining, for each group of data obtained by grouping, a data reading cycle of each group of data, respectively, according to the respective timing information of the group of data respectively determined, wherein the at lease one processor is further configured to;
group a same type of data into one group, or
group data generated by components in the industrial control system that belong to a same template into one group, wherein the same template is used for defining a set of components in one industrial control system and a relation
group logically interrelated data in the industrial control system into one group.

10. The apparatus of claim 9, wherein the simulation model is used by the at least one processor to simulate the industrial control system in a particular state.

11. The apparatus of claim 9, wherein the determining of a respective data reading cycle of each of the respective items of data includes:
determining the respective data reading cycle, such that an industrial application implemented according to the read items of data satisfies requirements of the industrial application.

12. The apparatus of claim 9, wherein the at least one processor, is further configured to invoke the machine-readable instructions to execute:
determining identifiers of the items of data in an instance model for the industrial control system;
determining identifiers of the items of data in the simulation model;
for each of the items of data,
determining a mapping relation between an identifier of the respective item of data in the instance model and a respective identifier of the respective item of data in the simulation model; and
configuring, according to the mapping relation determined and the data reading cycle of the respective item of data, a data reading cycle of the respective item of data in the industrial control system.

13. A non-transitory computer readable medium storing a program including instructions which, upon execution by a processor, implement the method of claim 5.

* * * * *